United States Patent

Minato et al.

[11] Patent Number: 6,067,930
[45] Date of Patent: May 30, 2000

[54] COAXIAL PLASMA PROCESSING APPARATUS

[75] Inventors: Mitsuaki Minato; Akira Uehara; Atsushi Matsushita, all of Kanagawa, Japan

[73] Assignee: Tokyo Ohka Kogyo Co., Ltd., Kanagawa, Japan

[21] Appl. No.: 07/979,254

[22] Filed: Nov. 20, 1992

[30] Foreign Application Priority Data

Nov. 22, 1991 [JP] Japan .................................. 3-334232

[51] Int. Cl.[7] ...................................................... C23C 16/00
[52] U.S. Cl. ...................................................... 118/723 E
[58] Field of Search ..................................... 118/723, 715, 118/728, 723 E, 723 ER; 156/345, 643

[56] References Cited

U.S. PATENT DOCUMENTS

| | | | |
|---|---|---|---|
| 4,367,114 | 1/1983 | Steinberg et al. | 156/345 |
| 4,372,806 | 2/1983 | Vossen, Jr. | 156/656 X |
| 5,099,100 | 3/1992 | Bersin et al. | 204/298.31 X |

FOREIGN PATENT DOCUMENTS

| | | |
|---|---|---|
| 1-95730 | 6/1989 | Japan . |
| 1-95731 | 6/1989 | Japan . |
| 4-17330 | 1/1992 | Japan . |
| 4-44225 | 2/1992 | Japan . |

Primary Examiner—Joni Chang
Attorney, Agent, or Firm—Carrier, Blackman & Associates, P.C.; Joseph P. Carrier; William D. Blackman

[57] ABSTRACT

A tubular reaction chamber is mounted on an annular insulating plate disposed on a grounded metallic base plate. A cylindrical outer electrode connected to a high-frequency power supply is disposed around said tubular reaction chamber, and a cylindrical inner electrode is disposed in said reaction chamber coaxially with said cylindrical outer electrode. The cylindrical inner electrode has a plurality of inlet holes defined therein, and a lower end disposed in an opening defined in the metallic base plate and fixed to said metallic base plate. A holder is disposed in said cylindrical inner electrode for supporting a plurality of wafers at spaced intervals.

18 Claims, 2 Drawing Sheets

COAXIAL PLASMA PROCESSING APPARATUS

BACKGROUND OF THE INVENTION

1. Field of the Invention

The present invention relates to a coaxial plasma processing apparatus for etching a wafer surface with a gas that is activated by a plasma or ashing a mask remaining on a wafer surface.

2. Description of the Relevant Art

Japanese laid-open utility model publication No. 1-95730 discloses a coaxial plasma processing apparatus having an outer electrode and an inner electrode that are arranged coaxially with each other. The disclosed coaxial plasma processing apparatus has a processing chamber around which the outer electrode connected to a high-frequency power supply is disposed, the outer electrode comprising a single cylindrical member or a pair of semicylindrical members. The processing chamber houses therein the inner electrode which is electrically insulated from the outer electrode and grounded by a metallic base plate. When a high-frequency electric energy is applied to the outer electrode, a plasma is generated between the inner and outer electrodes. A reaction gas (neutral particles) is activated by the plasma and introduced through inlet holes defined in the inner electrode into the inner electrode in which wafers are placed, for thereby etching the wafers or ashing masks on the wafers.

In the conventional plasma processing apparatus, many charged particles enter a reaction region through the inlet holes in the inner electrode, developing a charge-up condition or charge buildup in the reaction region, which tends to destroy the semiconductor devices or wafers.

SUMMARY OF THE INVENTION

It is therefore an object of the present invention to provide a coaxial plasma processing apparatus which produces a stable plasma without an undesirable charge buildup for processing semiconductor devices or wafers in a reaction chamber.

According to the present invention, there is provided a coaxial plasma processing apparatus comprising a metallic base plate having an opening defined therein, the metallic base plate being grounded, a reaction chamber disposed on the metallic base plate, a cylindrical outer electrode disposed around the reaction chamber, a high-frequency power supply connected to the cylindrical outer electrode, a cylindrical inner electrode disposed in the reaction chamber coaxially with the cylindrical outer electrode, the cylindrical inner electrode having a plurality of inlet holes defined therein, the cylindrical inner electrode having a lower end disposed in the opening and fixed to the metallic base plate, and an insulating plate covering an upper surface of the metallic base plate.

According to the present invention, there is also provided a coaxial plasma processing apparatus comprising a metallic base plate having an opening defined therein, the metallic base plate being grounded, an annular insulating plate disposed on the metallic base plate in covering relationship thereto, a tubular reaction chamber mounted on the annular insulating plate, a cylindrical outer electrode disposed around the tubular reaction chamber, a high-frequency power supply connected to the cylindrical outer electrode, a cylindrical inner electrode disposed in the reaction chamber coaxially with the cylindrical outer electrode, the cylindrical inner electrode having a plurality of inlet holes defined therein, the cylindrical inner electrode having a lower end disposed in the opening and fixed to the metallic base plate, and a holder disposed in the cylindrical inner electrode for supporting a plurality of wafers at spaced intervals.

The coaxial plasma processing apparatus may further comprise an insulating cover closing an upper end of the processing chamber remote from the metallic base plate, and a leaf spring mounted on a lower surface of the insulating cover for normally urging the cylindrical inner electrode downwardly toward the metallic base plate.

The cylindrical inner electrode may be grounded through the leaf spring, and may have a closed upper end.

Each of the inlet holes may have a diameter of 6 mm±0.1 mm, the inlet holes being spaced at a pitch of 8 mm±0.1 mm.

The holder may be supported on a table inserted in the opening.

Because of the insulating plate disposed on the metallic base plate in covering relationship thereto, an electric discharge is prevented from being developed between the cylindrical outer electrode and the metallic base plate, allowing a plasma to be generated stably and preventing a produced electric field from being disturbed. As a consequence, only neutral charges are introduced through the inlet holes in the cylindrical inner electrode into the reaction region in the reaction chamber, and hence no charge-up condition or charge buildup is developed in the reaction region.

The above and further objects, details and advantages of the present invention will become apparent from the following detailed description of a preferred embodiment thereof, when read in conjunction with the accompanying drawings.

DETAILED DESCRIPTION OF THE PREFERRED EMBODIMENT

Figure 1:
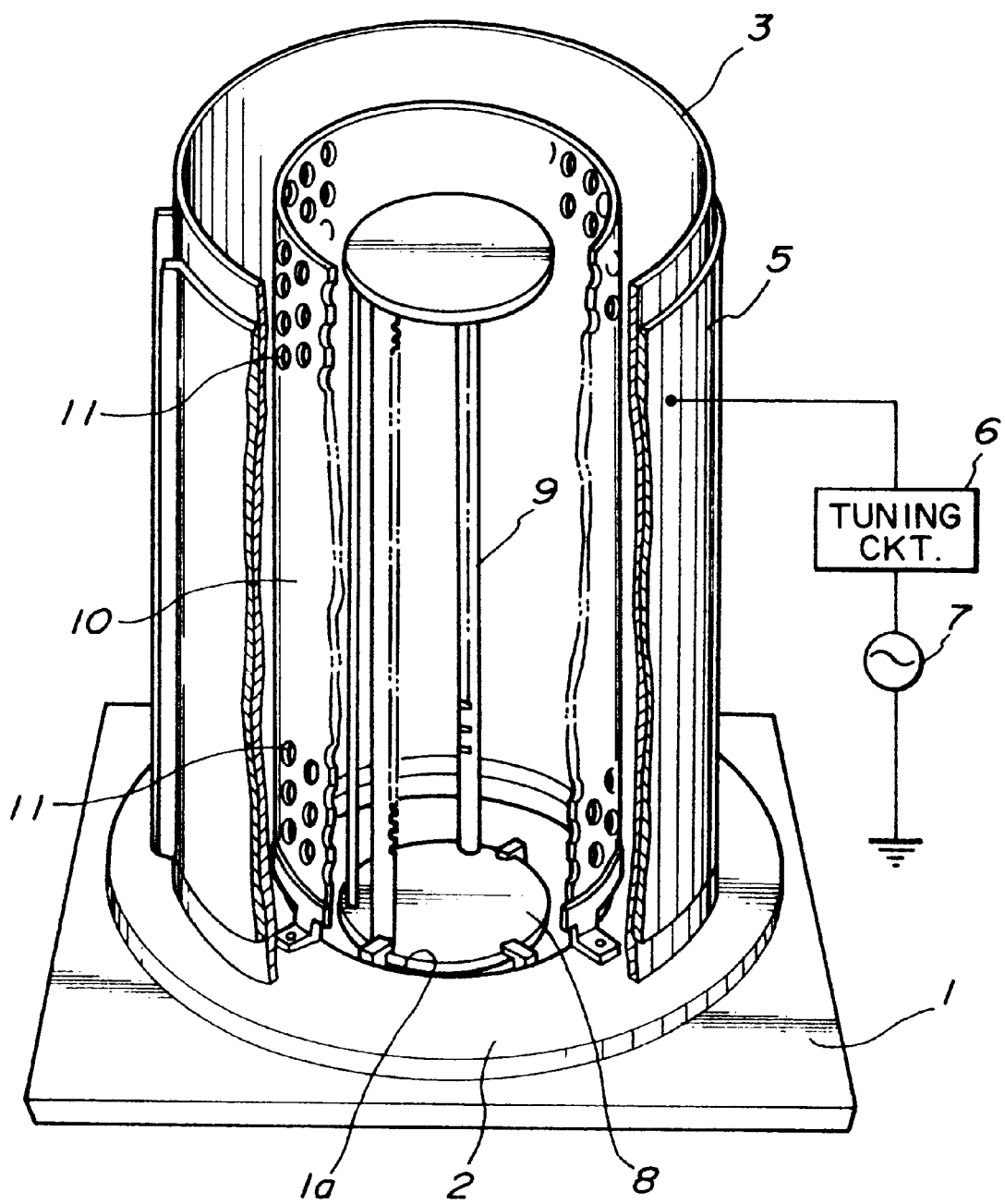
FIG. 1 is a perspective view, partly broken away, of a coaxial plasma processing apparatus according to the present invention.
Figure 2:
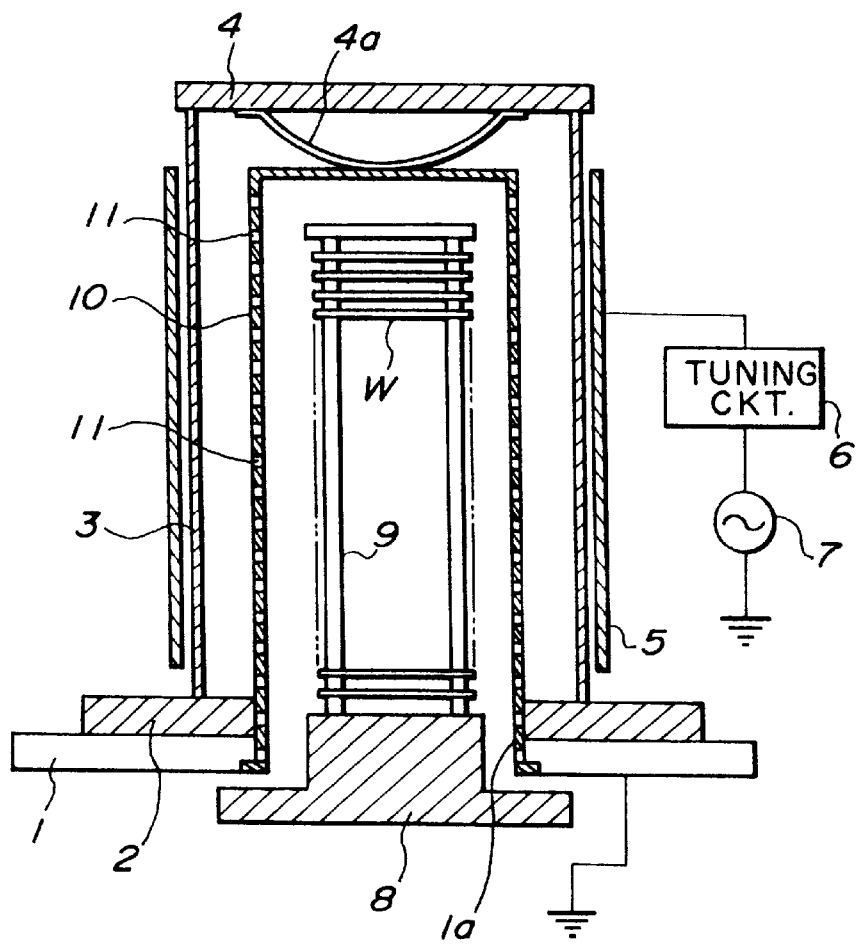
FIG. 2 is a vertical cross-sectional view of the coaxial plasma processing apparatus shown in FIG. 1.

As shown in FIGS. 1 and 2, a coaxial plasma processing apparatus embodying the principles of the present invention has a grounded base plate 1 of aluminum alloy having a substantially central circular opening 1a defined therein, an annular insulating plate 2 covering an upper surface of the base plate 2, a tubular reaction chamber 3 of synthetic quartz vertically disposed on the insulating plate 2, and an insulating cover 4 covering the upper opening of the tubular reaction chamber 3. The coaxial plasma processing apparatus also has a cylindrical outer electrode disposed around the tubular reaction chamber 3 and electrically connected to a high-frequency power supply 7 through a tuning circuit 6.

The opening 1a of the base plate 1 is closed by a grounded table 8 of aluminum alloy which has been brought upwardly into the opening 1a. A holder 9 which supports a plurality of semiconductor wafers W at vertically spaced intervals is vertically supported on the table 8.

Figure 3:
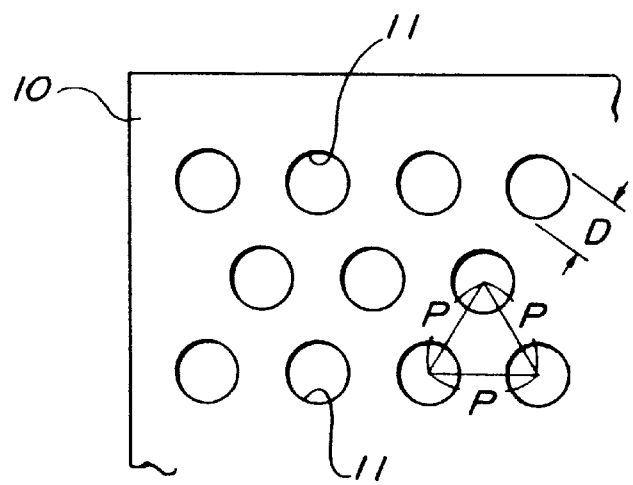
FIG. 3 is an enlarged fragmentary view of an inner electrode of the coaxial plasma processing apparatus shown in FIG. 1.

The coaxial plasma processing apparatus further has a cylindrical inner electrode 10 inserted in the opening 1a and having a lower end fixed to the edge of the opening 1a. The inner electrode 10 has its upper end closed and is disposed coaxially with and inside of the tubular reaction chamber 3 and hence the outer electrode 5. The inner electrode 10 is made of aluminum alloy and has a wall thickness of 2 mm with inlet holes 11 defined in its entire cylindrical wall. As shown in FIG. 3, each of the inlet holes 11 has a diameter D of 6 mm±0.1 mm. The inlet holes 11 are spaced at a pitch P of 8 mm±0.1 mm, i.e., two adjacent inlet holes 11 are spaced a distance P of 8 mm±0.1 mm from each other.

As shown in FIG. 2, a leaf spring 4a fixed to the lower surface of the cover 4 is resiliently held against the upper surface of the upper closed end of the inner electrode 10 for preventing the inner electrode 10 from wobbling and for conducting heat from the inner electrode 10 to the cover 4 to cool the inner electrode 10. Furthermore, the upper closed end of the inner electrode 10 is grounded through the leaf spring 4a.

The coaxial plasma processing apparatus operates as follows:

The holder 9 with the semiconductor wafers W supported thereon is inserted upwardly into a reaction region surrounded by the inner electrode 10. After the opening 1a of the base plate 1 is closed by the table 8, the tubular reaction chamber 3 is evacuated. Thereafter, a reaction gas is introduced into the tubular chamber 3, and a high-frequency electric energy is applied to the outer electrode 5. A plasma is now generated in the annular space that is defined between the tubular reaction chamber 3 and the inner electrode 10. Charged particles in the plasma are prevented from passing through the inlet holes 11 in the inner electrode 10, so that only neutral particles pass through the inlet holes 11 into the reaction region for thereby etching surfaces of the wafers W or ashing masks on the wafers W.

As described above, the lower end of the inner electrode 10 is inserted in the opening 1a defined in the grounded metallic base plate 1, and the upper surface of the metallic base plate 1 is covered with the insulating plate 2. Therefore, an electric discharge is prevented from being developed between the outer electrode 5 and the base plate 1, allowing the plasma to be stabilized and preventing the electric field from being disturbed. As a consequence, only neutral charges are introduced through the inlet holes 11 in the inner electrode 10 into the reaction region, and hence no charge-up condition or charge buildup is developed in the reaction region. Therefore, the semiconductor devices or wafers W are protected from destruction which would otherwise be liable to occur due to a charge-up condition in the reaction region. The upper end of the tubular reaction chamber 3 is closed by the insulating cover 4, and the grounded leaf spring 4a is fixed to the lower surface of the cover 4 in downwardly pressing engagement with the inner electrode 10. The leaf spring 4a is effective to hold the inner electrode 10 in position against wobbling movement and also to cool the inner electrode 10 through heat conduction for stabilizing an electric field in an upper portion of the coaxial plasma processing apparatus.

Although there has been described what is at present considered to be the preferred embodiment of the invention, it will be understood that the invention may be embodied in other specific forms without departing from the essential characteristics thereof. The present embodiment is therefore to be considered in all respects as illustrative, and not restrictive. The scope of the invention is indicated by the appended claims rather than by the foregoing description.

What is claimed is:

1. A coaxial plasma processing apparatus comprising:
   a metallic base plate having an opening defined therein, said metallic base plate being grounded;
   a reaction chamber disposed on said metallic base plate;
   a cylindrical outer electrode disposed around said reaction chamber;
   a high-frequency power supply connected to said cylindrical outer electrode;
   a cylindrical inner electrode disposed in said reaction chamber coaxially with said cylindrical outer electrode, said cylindrical inner electrode having a plurality of inlet holes defined therein, said cylindrical inner electrode having a lower end disposed in said opening and fixed to said metallic base plate; and
   an insulating plate covering an upper surface of said metallic base plate.

2. A coaxial plasma processing apparatus according to claim 1, further comprising a cover closing an upper end of said reaction chamber remote from said metallic base plate.

3. A coaxial plasma processing apparatus comprising:
   a metallic base plate having an opening defined therein, said metallic base plate being grounded;
   a reaction chamber disposed on said metallic base plate;
   a cylindrical outer electrode disposed around said reaction chamber,
   a high-frequency power supply connected to said cylindrical outer electrode;
   a cylindrical inner electrode disposed in said reaction chamber coaxially with said cylindrical outer electrode, said cylindrical inner electrode having a plurality of inlet holes defined therein, said cylindrical inner electrode having a lower end disposed in said opening and fixed to said metallic base plate;
   an insulating plate covering an upper surface of said metallic base plate;
   a cover closing an upper end of said processing chamber remote from said metallic base plate; and
   a leaf spring mounted on a lower surface of said cover for normally urging said cylindrical inner electrode downwardly toward said metallic base plate.

4. A coaxial plasma processing apparatus according to claim 1, wherein said cylindrical inner electrode has a closed upper end.

5. A coaxial plasma processing apparatus according to claim 1, wherein each of said inlet holes has a diameter of 6 mm±0.1 mm, and said inlet holes being spaced at a pitch of 8 mm±0.1 mm.

6. A coaxial plasma processing apparatus according to claim 1, further comprising a holder disposed in said cylindrical inner electrode for supporting a plurality of wafers at spaced intervals.

7. A coaxial plasma processing apparatus according to claim 6, further comprising a table inserted in said opening, said holder being supported on said table.

8. A coaxial plasma processing apparatus comprising:
   a metallic base plate having an opening defined therein, said metallic base plate being grounded;
   an annular insulating plate disposed on said metallic base plate in covering relationship thereto;
   a tubular reaction chamber mounted on said annular insulating plate;
   a cylindrical outer electrode disposed around said tubular reaction chamber;

a high-frequency power supply connected to said cylindrical outer electrode;

a cylindrical inner electrode disposed in said reaction chamber coaxially with said cylindrical outer electrode, said cylindrical inner electrode having a plurality of inlet holes defined therein, said cylindrical inner electrode having a lower end disposed in said opening and fixed to said metallic base plate; and a holder disposed in said cylindrical inner electrode for supporting a plurality of wafers at spaced intervals.

9. A coaxial plasma processing apparatus according to claim 8, further comprising a cover closing an upper end of said reaction chamber remote from said metallic base plate.

10. A coaxial plasma processing apparatus comprising:

a metallic base plate having an opening defined therein, said metallic base plate being grounded;

an annular insulating plate disposed on said metallic base plate in covering relationship thereto;

a tubular reaction chamber mounted on said annular insulating plate;

a cylindrical outer electrode disposed around said tubular reaction chamber;

a high-frequency power supply connected to said cylindrical outer electrode;

a cylindrical inner electrode disposed in said reaction chamber coaxially with said cylindrical outer electrode, said cylindrical inner electrode having a plurality of inlet holes defined therein, said cylindrical inner electrode having a lower end disposed in said opening and fixed to said metallic base plate;

a holder disposed in said cylindrical inner electrode for supporting a plurality of wafers at spaced intervals;

a cover closing an upper end of said processing chamber remote from said metallic base plate; and a leaf spring mounted on a lower surface of said cover for normally urging said cylindrical inner electrode downwardly toward said metallic base plate.

11. A coaxial plasma processing apparatus according to claim 8, wherein said cylindrical inner electrode has a closed upper end.

12. A coaxial plasma processing apparatus according to claim 8, wherein each of said inlet holes has a diameter of 6 mm±0.1 mm, said inlet holes being spaced at a pitch of 8 mm±0.1 mm.

13. A coaxial plasma processing apparatus according to claim 8, further comprising a table inserted in said opening, said holder being supported on said table.

14. A coaxial plasma processing apparatus according to claim 1, wherein said insulating plate completely covers the upper surface of said metallic base plate.

15. A coaxial plasma processing apparatus according to claim 1, wherein said insulating plate is disposed between said reaction chamber and said metallic base plate.

16. A coaxial plasma processing apparatus according to claim 1, wherein said insulating plate is disposed between said outer electrode and said metallic base plate.

17. A coaxial plasma processing apparatus according to claim 1, wherein said insulating plate disposed on the upper surface of said metallic base plate prevents electric discharge from being developed between said cylindrical outer electrode and said metallic base plate.

18. A coaxial plasma processing apparatus according to claim 8, wherein said insulating plate disposed on the upper surface of said metallic base plate prevents electric discharge from being developed between said cylindrical outer electrode and said metallic base plate.

* * * * *